(12) United States Patent
Wang et al.

(10) Patent No.: US 9,093,565 B2
(45) Date of Patent: Jul. 28, 2015

(54) FIN DIODE STRUCTURE

(71) Applicant: UNITED MICROELECTRONICS CORP., Hsin-Chu (TW)

(72) Inventors: Chang-Tzu Wang, Taoyuan County (TW); Ping-Chen Chang, Pingtung County (TW); Tien-Hao Tang, Hsinchu (TW); Kuan-Cheng Su, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 24 days.

(21) Appl. No.: 13/941,555

(22) Filed: Jul. 15, 2013

(65) Prior Publication Data
US 2015/0014809 A1    Jan. 15, 2015

(51) Int. Cl.
*H01L 21/70* (2006.01)
*H01L 29/861* (2006.01)
*H01L 21/76* (2006.01)
*H01L 27/02* (2006.01)

(52) U.S. Cl.
CPC .............. *H01L 29/861* (2013.01); *H01L 21/76* (2013.01); *H01L 27/0255* (2013.01)

(58) Field of Classification Search
CPC .................. H01L 21/823431; H01L 21/845; H01L 27/0886; H01L 27/0924
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 8,610,241 B1 * | 12/2013 | Hu et al. | 257/526 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2014/0131831 A1 * | 5/2014 | Wei et al. | 257/506 |

* cited by examiner

*Primary Examiner* — Cuong Q Nguyen
*Assistant Examiner* — Nishath Yasmeen
(74) *Attorney, Agent, or Firm* — Winston Hsu; Scott Margo

(57) ABSTRACT

A fin diode structure and method of manufacturing the same is provided in present invention, which the structure includes a substrate, a doped well formed in the substrate, a plurality of fins of first conductivity type and a plurality of fins of second conductivity type protruding from the doped well, and a doped region of first conductivity type formed globally in the substrate between the fins of first conductivity type, the fins of second conductivity type, the shallow trench isolation and the doped well and connecting with the fins of first doped type and the fins of second doped type.

5 Claims, 3 Drawing Sheets

FIN DIODE STRUCTURE

BACKGROUND OF THE INVENTION

1. Field of the Invention

The present invention relates generally to a fin diode structure and a method of manufacturing the same, and more particularly, to a fin diode structure with globally-doped regions in the substrate which is compatible with the process flow of normal fin field effect transistors (FinFET).

2. Description of the Prior Art

The use of fin field effect transistors (FinFETs) in the semiconductor technology keeps rising as the size of technology decreases. FinFETs are advantageous in smaller technologies because of their relatively higher drive current when compared to devices of similar size and because of their general ability to prevent short-channel effects. FinFETs generally have increased drive currents because the gate wraps around the channel such that the effective width of the channel is increased. The increased channel width allows for a greater drive current. Furthermore, by having the gate wrap around the channel, the gate can suppress leakage current through the channel more easily, thereby decreasing the short channel effects.

The above-identified advantages of FinFETs have led to their use in smaller technologies, particularly in 32 nm node and smaller. However, the trade-off for smaller size results an increased susceptibility of failure of the FinFET devices due to the electrostatic discharge (ESD) issue. It is well known in the semiconductor field that extremely high voltages can be produced in the vicinity of an integrated circuit due to the build-up of static charges. A high potential maybe generated at an input or output buffer of the integrated circuit, which may be caused by a person touching a package pin that is in electrical contact with the input or output buffer. When the electrostatic charges are discharged, a high current is produced at the package nodes of the integrated circuit, and this issue is referred as electrostatic discharge (ESD). ESD is a serious problem for semiconductor devices since it has the potential to damaging the entire integrated circuit. Especially for the FinFET device, the active area width of a FinFET is much smaller than that of another device of corresponding technology size. The smaller width may lead to increased current density in the FinFET when the ESD event occurs, which means that the tolerable and allowable threshold current density is smaller for the FinFET device.

For example, FinFETs typically have a threshold current density of 0.1 mA/μm before device breakdown occurs as compared to approximately 2 mA/μm for planar bulk MOSFETs or approximately 1.4 mA/μm for planar SOI MOSFETs. This extremely small current density may cause the dielectric gate oxide to breakdown easily between the active area and the gate and short circuit the gate and the active area. Thus, FinFETs are generally more susceptible to device failures from electrostatic discharge issue because of their relatively small channel width, and a solution is needed to overcome this problem.

SUMMARY OF THE INVENTION

In order to prevent the failure of the devices, diodes are usually used with microelectronic devices for the electrostatic discharge protection in sensitive solid-state circuits. A FinFET diode structure with novel, globally-doped region is provided in the present invention to solve the ESD issue. The design of this globally-doped region may effectively reduce the on-resistance (Ron) of the device and provide an improved current channel which main junction may be adjusted to the desired position or aspect. Moreover, the fin diode structure of present invention is compatible to the process flow of normal FinFET. That is, the fin diode structure of the present invention and FinFETs may be manufactured in the same process without developing additional manufacturing steps or process.

One object of the present invention is to provide a fin diode structure, which the structure includes a substrate, a doped well formed in the substrate, a plurality of fins of first conductivity type and a plurality of fins of second conductivity type protruding from the doped well, wherein each fin of first conductivity type and second conductivity type are isolated by a shallow trench isolation, and a doped region of first conductivity type formed globally in the substrate between the fins of first conductivity type, the fins of second conductivity type, the shallow trench isolation and the doped well and connecting with the fins of first conductivity type and the fins of second conductivity type.

Another object of the present invention is to provide a fin diode structure, which the structure includes a substrate, a doped well formed in the substrate, a plurality of fins of first conductivity type and a plurality of fins of second conductivity type protruding from the substrate, wherein each fin of first conductivity type and second conductivity type are isolated by a shallow trench isolation, and at least one doped regions of first conductivity type formed in the substrate between the fins of first conductivity type, a portion of shallow trench isolation and the doped well and connecting with the fins of first conductivity type, and at least one doped regions of second conductivity type formed in the substrate between the fins of second conductivity type, a portion of the shallow trench isolation and the doped well and connecting with the fins of second conductivity type, wherein the doped region of first conductivity type connects with the doped region of second conductivity type in the substrate to form a junction.

Still another object of the present invention is to provide a method of manufacturing a fin diode structure, which the manufacturing steps includes: providing a substrate, forming a doped well in the substrate, forming at least one doped region of first conductivity type or at least one doped region of second doped type in the doped well, performing an etch process to the doped region of first conductivity type or the doped region of second conductivity type to form a plurality of fins on the doped region of first conductivity type or the doped region of second conductivity type, forming shallow trench isolations between each fin, and performing a doping process to the fins to form fins of first conductivity type and fins of second conductivity type.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
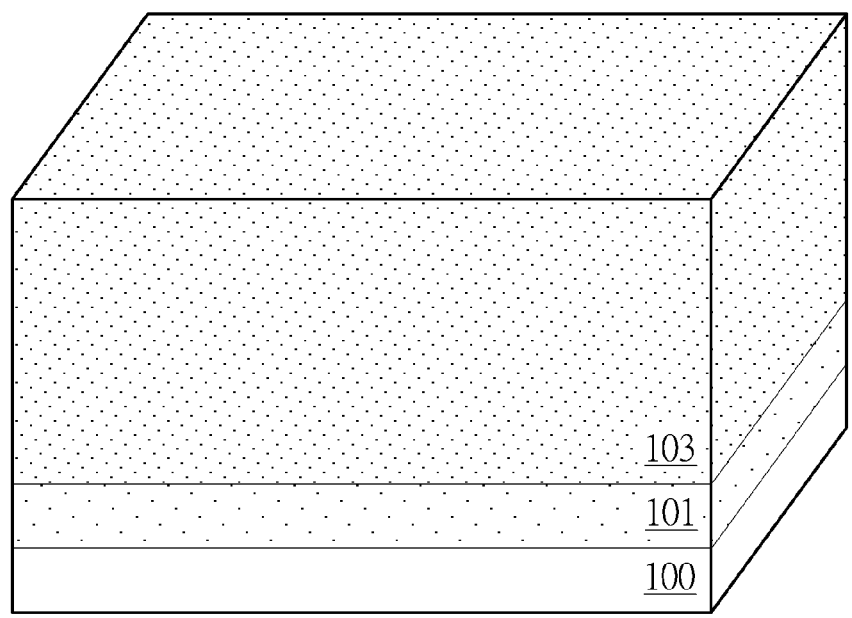
FIGS. 1-4 are schematic views illustrating a process flow of manufacturing a fin diode structure with a doped region of first conductivity type in accordance with one embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer first to FIGS. 1-4, which are schematic views illustrating a process flow of manufacturing a fin diode structure with a doped region of first conductivity type in accordance with one embodiment of present invention. First, as shown in FIG. 1, provide a substrate 100 to serve as a base for forming the devices and components of the present invention. The substrate 100 may be, for example, a silicon substrate, a silicon-containing substrate, a III-V group-on-silicon (such as GaN-on-silicon) substrate or a graphene-on-silicon substrate, etc. A doped well 101, such as a P-well or a N-well, is then formed in the substrate 100. For example, the doped well 101 may be formed by implanting dopants (ex. boron as P-type dopants or phosphorus and arsenic as N-type dopants) of predetermined doping concentration into the substrate 100 via an ion implantation process. For the simplicity of the description hereinafter, a first conductivity type and a second conductivity type is used to represent two different doping types. The doped well shown in FIG. 1 may be first conductivity type, such as P-type.

In next step, a doped region 103 of first conductivity type is formed in the doped well 101. The doped region 103 of first conductivity type may be formed by further diffusion process to diffuse the dopants of first conductivity type with higher doping concentration into a predetermined depth range in the doped well 101 of first conductivity type. That is, the doping concentration (ex. P-) of the doped region 103 is higher than the doping concentration (ex. P) of the doped well 101. Alternatively, the doped region 103 may be formed by an ion implantation process to implant the dopants of first conductivity type into the doped well 101. The doped region 103 will serve as a current channel for the fin diode device of present invention.

Figure 2:
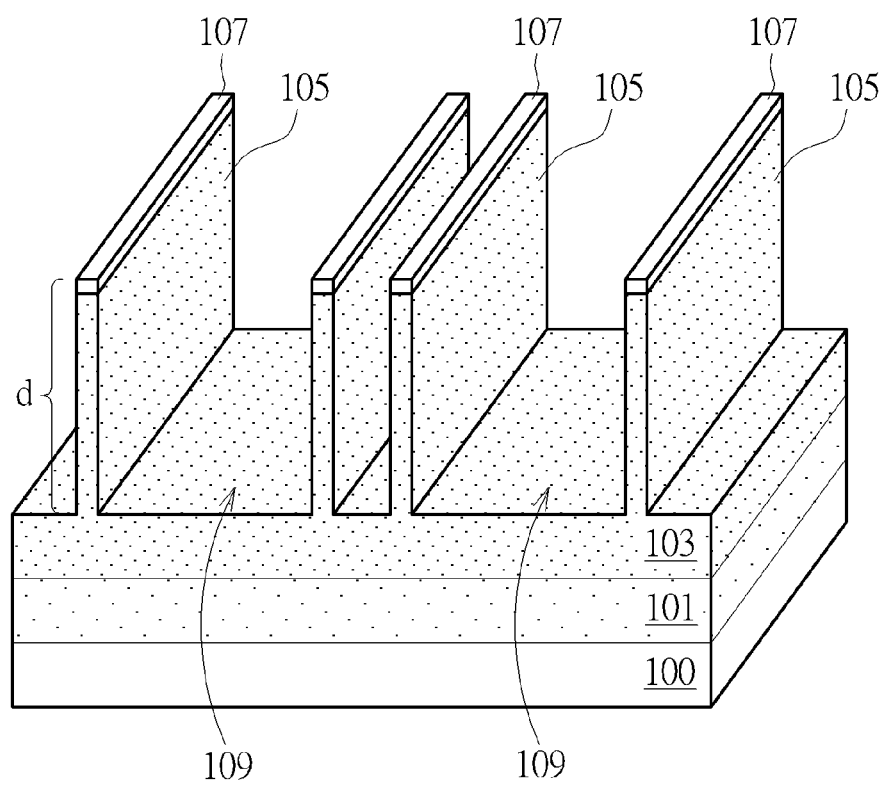

After the doped region 103 of first conductivity type is formed, as shown in FIG. 2, an etch process is then performed to the doped region 103 to etch out a plurality of protruding fins 105. More specifically, the step of forming a plurality of fins 105 may comprise: first forming patterned hard mask (such as a silicon oxide layer and/or a silicon nitride layer) 107 on the doped region 103, then using the patterned hard mask 107 as an etch mask to etch the doped region 103 to a predetermined depth d, so that the pattern defined by the patterned hard mask 107 may be transferred to the doped region 103, thereby forming a plurality of protruding and parallel fins 105 as shown in FIG. 2. A trench 109 is formed between each fin 105, and the doped region 103 of first conductivity type with a predetermined thickness still remains under the fins 105. Please note that the above-identified steps of forming fins 105 may also be used to form the fin structures on the active area of the substrate. In normal FinFET process, a gate oxide layer and gate maybe formed sequentially on this kind of fin structures in the active area to manufacture a FinFET device.

Figure 3:
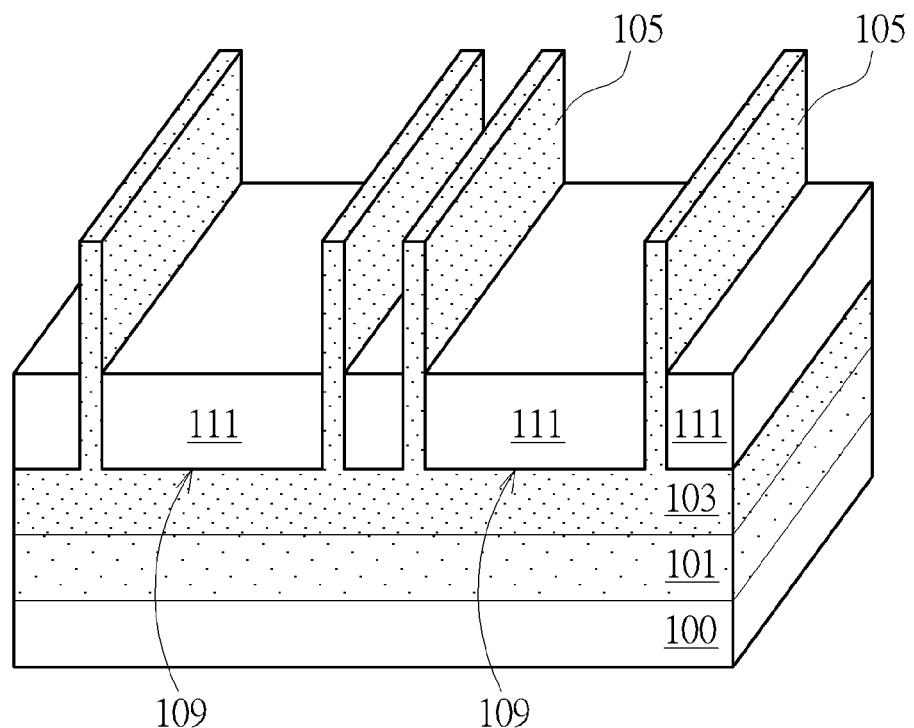

After forming a plurality of fins 105, as shown in FIG. 3, shallow trench isolations (STI) 111 with a predetermined thickness are formed in the trench 109 between each fin 105. The fins 105 may be isolated from each other by the STI 111, so that the fins 105 may be manufactured into individual devices. More specifically, the step of forming STI 111 may comprises: globally depositing a silicon oxide layer on the surface of the doped region 103 and the fins 105; using the patterned hard mask 107 on the fins 105 as a polishing stop layer to perform a chemical mechanical polishing (CMP) process, such that only the silicon oxide layer on the sidewall of the fins 105 and in the trench 109 is kept after the polishing process; finally, performing an etch back process to remove the silicon oxide layer on the sidewall of fins 105 above a predetermined height, thereby forming the STI 111 with a predetermined thickness in the trench 109 as shown in FIG. 3. In a preferred embodiment, the width of fin 105 maybe approximately 20 nm, the width of the STI 111 between two fins may be approximately 300 nm, and the length of the portion of the fin 105 protruding out from the STI 109 may be approximately 60 nm. Furthermore, the hard mask 107 on the fin 105 may be removed for manufacturing a tri-gate FET on the fin structure in the active area of the substrate. Alternatively, the hard mask 107 on the fin 105 may be kept for manufacturing a FinFET on the fin structure in the active area of the substrate. Please note that the doped region 103 may be formed after the fins 105 and the STI 111 are formed.

After the doped region 103 of first conductivity type is formed, as shown in FIG. 2, an etch process is then performed to the doped region 103 to etch out a plurality of protruding fins 105 (i.e. fin structures). More specifically, the step of forming a plurality of fins 105 may comprise: first forming patterned hard mask (such as a silicon oxide layer and/or a silicon nitride layer) 107 on the doped region 103, then using the patterned hard mask 107 as an etch mask to etch the doped region 103 to a predetermined depth d, so that the pattern defined by the patterned hard mask 107 may be transferred to the doped region 103, thereby forming a plurality of protruding and parallel fins 105 as shown in FIG. 2. A trench 109 is formed between each fin 105, and the doped region 103 of first conductivity type with a predetermined thickness still remains under the fins 105. Please note that the above-identified steps of forming fins 105 may also be used to form the fin structures on the active area of the substrate. In normal FinFET process, a gate oxide layer and gate may be formed sequentially on this kind of fin structures in the active area to manufacture a FinFET device.

Figure 4:
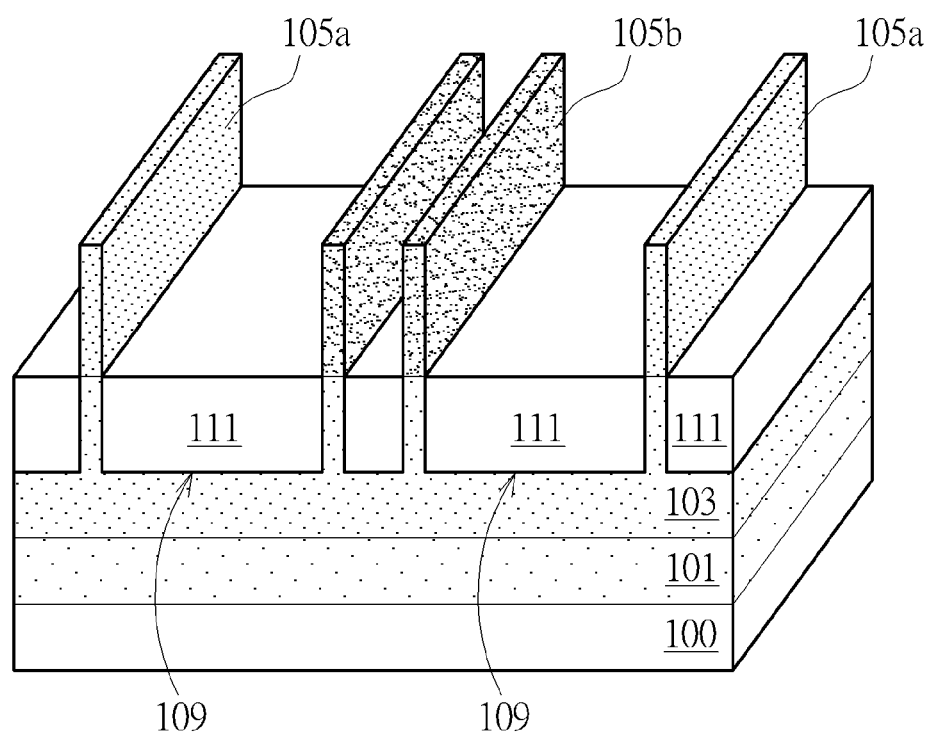

Through this manufacturing method, as shown in FIG. 4, the doped region 103 of first doped type is globally formed in the doped well 101 under the fins 105a of first conductivity type, the fins 105b of second conductivity type and the STI 111, and the doped region 103 of first conductivity type connects with the fins 105a of first conductivity type and the fins 105b of second conductivity type. By using this design, the current from the fins 105*a* of first conductivity type may be easily conducted to the adjacent fins 105*b* of second conductivity type through the doped region 103 of first conductivity type, thereby effectively lowering the on-resistance of the device.

Figure 5:
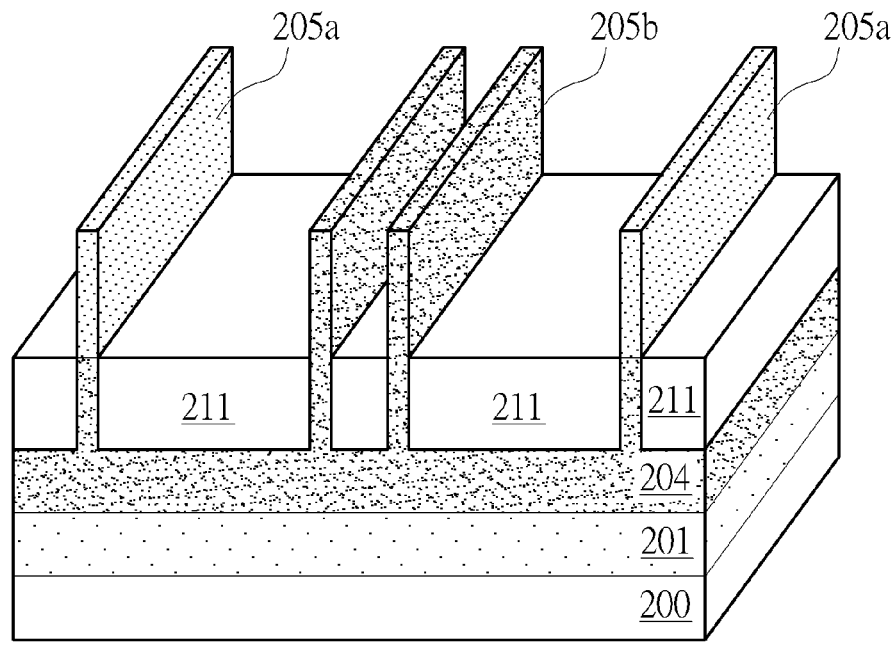
FIG. 5 is a schematic view illustrating a fin diode structure with a doped region of second conductivity type in accordance with another embodiment of present invention.

Please refer now to FIG. 5, which is a schematic view illustrating a fin diode structure with a doped region of second conductivity type in accordance with another embodiment of present invention. In comparison to the embodiment shown in FIG. 4, in this embodiment, the doped region 204 formed in the doped well 201 is second conductivity type (ex. N-type). Similarly, the doped region 204 may also be formed by an ion implantation process or a diffusion process to dope the dopants of second conductivity type (such as P or As) with a predetermined doping concentration (ex N-) into the doped well 201.

Through this manufacturing method, as shown in FIG. 4, the doped region 103 of first doped type is globally formed in the doped well 101 under the fins 105*a* of first conductivity type, the fins 105*b* of second conductivity type and the STI 111, and the doped region 103 of first conductivity type connects with each of the fins 105*a* of first conductivity type and each of the fins 105*b* of second conductivity type respectively in one fin structure, the fin 105, such that junctions are formed in the fin structures where the fins 105*b* of second conductivity type connect with the doped region 103 of first conductivity type. By using this design, the current from the fins 105*a* of first conductivity type may be easily conducted to the adjacent fins 105*b* of second conductivity type through the doped region 103 of first conductivity type, thereby effectively lowering the on-resistance of the device.

According to the above-mentioned embodiments shown in FIGS. 1-4, a fin diode structure is also provided in present invention, wherein the structure includes a substrate 100, a doped well 101 formed in the substrate 100, a plurality of fins 105*a* of first conductivity type and a plurality of fins 105*b* of second conductivity type protruding on the substrate 100, and a doped region 103 of first conductivity type formed globally in the substrate 100 between the fins 105*a* of first conductivity type, the fins 105*b* of second conductivity type, the STI 111 and the doped well 101, and the doped region 103 of first conductivity type connects with the fins 105*a* of first conductivity type and the fins 105*b* of second conductivity type.

Figure 6:
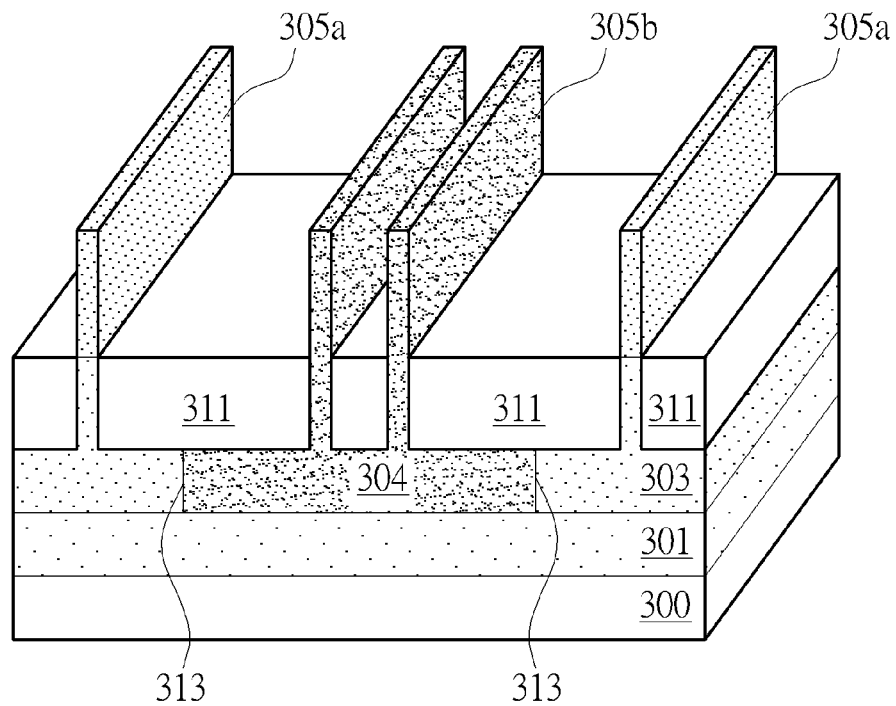
FIG. 6 is a schematic view illustrating a fin diode structure with both doped regions of first doped type and doped regions of second conductivity type in accordance with still another embodiment of present invention.

Furthermore, another fin diode structure is also provided in present invention, as shown in FIG. 6, wherein the structure includes a substrate 300, a doped well 301 formed in the substrate 300, a plurality of fins 305*a* of first conductivity type and a plurality of fins 305*b* of second conductivity type protruding on the substrate 300, and a doped region 303 of first conductivity type formed in the substrate 100 between the fins 305*a* of first conductivity type, a portion of the STI 311 and the doped well 301 and connecting with the fins 305*a* of first conductivity type, and a doped region 304 of second conductivity type formed in the substrate 300 between the fins 305*b* of second conductivity type, a portion of the STI 311 and the doped well 301 and connecting with the fins 305*b* of second conductivity type.

The fin diode structure in present invention may be used in field of, including, complementary metal oxide semiconductor (CMOS), bipolar junction transistor (BJT), or electrostatic discharge (ESD) protection diode, etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin diode structure, comprising:
a substrate;
a doped well formed in said substrate;
a plurality of fins of first conductivity type and a plurality of fins of second conductivity type protruding from said doped well, wherein said fins of first conductivity type and said fins of second conductivity type are isolated from each other by shallow trench isolations, and a doped region of first conductivity type formed globally in said substrate between said fins of first conductivity type, said fins of second conductivity type, said shallow trench isolations and said doped well and connecting with said fins of first conductivity type and said fins of second conductivity type; and
the doping concentration of said fin of first conductivity type is higher than the doping concentration of said doped region of first conductivity type, and the doping concentration of said doped region of first conductivity type is higher than the doping concentration of said doped well of first conductivity type.

2. The fin diode structure according to claim 1, further comprising a plurality of fin structures, wherein said doped region of first conductivity type connects with said fins of second conductivity type in some of said fin structures to form junctions.

3. The fin diode structure according to claim 1, wherein said first conductivity type is P-type, and said second conductivity type is N-type.

4. The fin diode structure according to claim 1, wherein said first conductivity type is N-type, and said second conductivity type is P-type.

5. The fin diode structure according to claim 1, wherein said doped well is a doped well of first conductivity type or a doped well of second conductivity type.

* * * * *